United States Patent [19]
Wada et al.

[11] Patent Number: 5,596,474
[45] Date of Patent: Jan. 21, 1997

[54] POWER PROTECTION CIRCUITRY FOR A SEMICONDUCTOR INTEGRATED CIRCUIT

[75] Inventors: Toshio Wada; Eiichi Iwanami, both of Tateyama, Japan

[73] Assignee: Nittetsu Semiconductor Co., Ltd., Tateyama, Japan

[21] Appl. No.: 534,541

[22] Filed: Sep. 27, 1995

[30] Foreign Application Priority Data

Sep. 28, 1994 [JP] Japan .................................. 6-258692

[51] Int. Cl.$^6$ ..................................................... H02H 3/20
[52] U.S. Cl. ............................................. 361/111; 361/56
[58] Field of Search ................................ 361/18, 56, 111, 361/91, 118, 119; 257/355, 365, 366

[56] References Cited

U.S. PATENT DOCUMENTS

| | | | |
|---|---|---|---|
| 4,686,383 | 8/1987 | Crofit | 361/91 |
| 5,361,185 | 11/1994 | Yu | 361/111 |
| 5,440,162 | 8/1995 | Worley et al. | 257/355 |

Primary Examiner—Jeffrey A. Gaffin
Assistant Examiner—Ronald W. Leja
Attorney, Agent, or Firm—Burns, Doane, Swecker & Mathis, LLP

[57] ABSTRACT

Power protection circuitry comprising a first capacitor directly connected between a supply voltage line and a reference voltage line (ground line); a pair of MOS transistors cascade connected between the supply voltage line and the reference voltage line; and a second capacitor and a resistor (a CR circuit) connected in series between the supply voltage line and the reference voltage line. Part of abnormal, high frequency voltage resulting from static electricity applied to the supply voltage line is discharged via the first capacitor. The rest of the applied high frequency voltage, which the first capacitor fails to absorb, is discharged into the reference voltage line via the channels of the pair of MOS transistors turning on with a turn-on voltage supplied by a turn-on voltage supply circuit (the CR circuit) comprising the second capacitor and the resistor.

5 Claims, 2 Drawing Sheets

POWER PROTECTION CIRCUITRY FOR A SEMICONDUCTOR INTEGRATED CIRCUIT

BACKGROUND OF THE INVENTION

The present invention relates to a power protection circuitry for a semiconductor integrated circuit, which protects components of an integrated circuit from abnormal, high frequency voltage resulting from static electricity and so on applied to the power terminals of the integrated circuit. The present invention particularly relates to the power protection circuitry which protects an integrated circuit comprising MOS (Metal Oxide Semiconductor) transistors.

Conventionally, in order to protect components of a semiconductor integrated circuit from abnormal, high frequency voltage resulting from static electricity, a capacitor is inserted between a supply voltage line (Vcc) and a reference voltage line (a ground line, Vss) to absorb high frequency voltage applied to the supply voltage line from an outside source, such as from a human body.

However, the capacitor is usually connected to the supply voltage line (Vcc) and the reference voltage line (the ground line, Vss) with wiring made of aluminum, which generates inductance and resistance of the electrodes of the capacitor. Therefore, the method of using a capacitor is not sufficient for absorbing high frequency voltage completely. Even an application of a relatively low electrostatic voltage may damage PN junctions of the integrated circuit.

The conventional methods other than the one described above include a method which inserts a diode consisting of a MOS transistor with a high threshold voltage between a supply voltage line (Vcc) and a reference voltage line (the ground line, Vss). Another conventional method uses the LOGOS (local oxidization of silicon) or the selective oxidization method which isolates components with a field oxide film to form a parasitic transistor to protect components of an integrated circuit (Japanese Patent Laid-Open No. 68575/1992). Another conventional method is to insert a series circuit of a resistor and an n-channel MIS FET (Metal Insulator Semiconductor Field Effect Transistor) between a supply voltage line (Vcc) and a reference voltage line (Vss) (Japanese Patent Laid-Open No. 45850/1988).

Each of the conventional methods stated above has the following problems. In the case of the method of using a diode consisting of aMOS transistor with a high threshold voltage, an additional step of inserting a diode is required especially when the field isolation method of MOS structure is used to isolate components in an integrated circuit. The problem is that the number of steps in the manufacturing process is increased.

The method of forming a parasitic transistor by using the LOGOS isolation (Japanese Patent Laid-Open No. 68575/1992) is only effective so long as the threshold voltage of a parasitic transistor is 15V or above. It is impossible to use the method when the threshold voltage of the transistor is 2 to 10V. The method is effective so long as components of the integrated circuit are isolated using the field isolation of MOS structure. The method is, however, not applicable to those integrated circuits using other methods such as a PN junction isolation method.

In the case of the method using a series circuit of a resistor and an n-channel MIS FET (Japanese Patent Laid-Open No. 45850/1988), not only when abnormal, high frequency voltage is applied, but also during normal operation, a steady current is fed to a protective circuit, which increases power consumption during normal operation.

SUMMARY OF THE INVENTION

The present invention serves to solve the problems described above. It is an objective of the invention to provide an improved power protection circuitry for a semiconductor integrated circuit, which can be manufactured without additional steps in the manufacturing process for a semiconductor integrated circuit of MOS structure. The power protection circuitry is applicable regardless of the methods of components isolation of the integrated circuit. The power protection circuitry prevents an increase in power consumption during normal operation.

The power protection circuitry for a semiconductor integrated circuit has a first and a second discharge circuits. The power protection circuit is connected between a supply voltage line and a reference voltage line. The first discharge circuit discharges part of abnormal, high frequency voltage applied to the supply voltage line into the reference voltage line. The second discharge circuit has a switching circuit composed of a pair of MOS transistors of the same conductivity type and a turn-on voltage supply circuit to supply turn-on voltage to each gate of the pair of MOS transistors. The second discharge circuit simultaneously turns on the pair of MOS transistors and discharges abnormal, high frequency voltage into the reference voltage line via the pair of MOS transistors.

The power protection circuitry for a semiconductor integrated circuit is configured as described hereinafter. In the power protection circuit, the first discharge circuit contains a first capacitor connected between the supply voltage line and the reference voltage line in a semiconductor integrated circuit. The second discharge circuit has the first MOS transistor of one conductivity type of which drain is connected to the supply voltage line, and the second MOS transistor of which conductivity type is the same as that of the first MOS transistor, with a drain connected to the source of the first MOS transistor and with a source connected to the reference voltage line. The gate of the second MOS transistor is connected to the gate of the first MOS transistor. The second discharge circuit contains a second capacitor connected between the supply voltage line and the interconnected gates of the first and second MOS transistors. The second discharge circuit contains a resistor connected to the reference voltage line and the interconnected gates of the first and second MOS transistors. The resistor forms a CR circuit along with the second capacitor.

In the power protection circuitry, part of abnormal high frequency voltage such as static electricity applied to the supply voltage line is discharged via the first discharge circuit (the first capacitor). In the second discharge circuit, high frequency voltage causes the turn-on voltage supply circuit to supply a turn-on voltage to the first and second MOS transistors. The first and second MOS transistors instantaneously turn on to discharge high frequency voltage into the reference voltage line (the ground line) via the channels of these transistors. Thus even electricity which the first discharge circuit (the first capacitor) fails to absorb is fully discharged. As a result, electrostatic resistance of the integrated circuit improves. The power protection circuitry prevents an increase in power consumption during normal operation. The power protection circuitry my be formed at the same step of manufacturing as MOS transistors comprising the integrated circuit. No additional step of manufacturing process is thus required, which prevents an increase in manufacturing costs.

In the power protection circuitry, the time constant of the CR circuit including the second capacitor and resistor is set to 15 nanoseconds to 1 microsecond.

For the power protection circuitry, the time constant of the CR circuit is set to 15 nanoseconds to 1 microsecond so as to turn on the first and second MOS transistors only at an application of abnormal high frequency voltage resulting from static electricity. The first and second MOS transistors do not turn on during normal operation and just when power is supplied to the integrated circuit. Thus high frequency voltage applied to the supply voltage line is discharged into the reference voltage line (ground line), and the original operation of the integrated circuit is ensured while the voltage level of the supply voltage line is normal.

The power protection circuitry for a semiconductor integrated circuit includes diffusion layers forming the sources and drains of the first and second MOS transistors and gate electrodes, which are rectangle-shaped across the channel. The diffusion layers and the gate electrodes are arranged parallel with each other.

The power protection circuitry for a semiconductor integrated circuit has a power wiring layer as the supply voltage line and a reference layer as the reference voltage line. The power wiring layer covers the diffusion layer forming the drain of the first MOS transistor. A contact is made between the diffusion layer and the power wiring layer. At the same time the reference wiring layer covers the diffusion layer forming the source of the second MOS transistor. A contact is made between the diffusion layer and the reference wiring layer.

BRIEF DESCRIPTIONS OF THE DRAWINGS

DESCRIPTION OF THE PREFERRED EMBODIMENT

Hereinafter the preferred embodiment of the present invention is described in detail referring to the accompanying drawings. The present invention may be embodied in specific forms other than the following embodiment without departing from the spirit or essential characteristics thereof.

Figure 1:
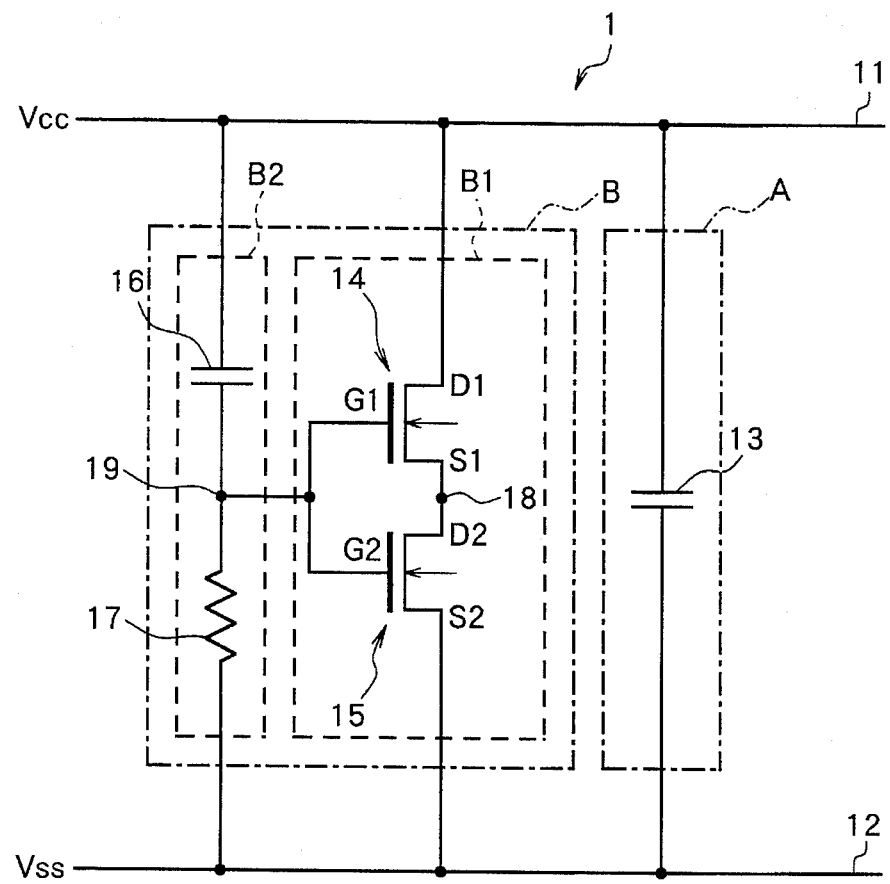
FIG. 1 is a circuit diagram of a power protection circuitry for a semiconductor integrated circuit related to the preferred embodiment of the present invention.

FIG. 1 shows the configuration of a power protection circuitry for a semiconductor integrated circuit concerning the preferred embodiment of the present invention. Power protection circuitry 1 contains a first discharge circuit A and a second discharge circuit B located between a supply voltage line (Vcc) 11 and a reference voltage line (Vss) 12. The voltage level of the supply voltage line 11 is set to an operating voltage of the semiconductor integrated circuit such as 5V. The voltage level of the reference voltage line 12 is set to the ground voltage of the integrated circuit (OV).

The first discharge circuit A has a capacitor 13 as a first capacitor directly connected between the supply voltage line 11 and the reference voltage line 12. Part of abnormal high frequency voltage applied to the supply voltage line (Vcc) is discharged via the capacitor 13 into the reference voltage line 12.

The second discharge circuit B contains a switching circuit B1 and a turn-on voltage supply circuit (CR circuit) B2. The switching circuit B1 has an n-channel transistor 14 as a first MOS transistor and another n-channel transistor 15 as a second transistor which are cascade connected between the supply voltage line 11 and the reference voltage line 12. The turn-on voltage supply circuit B2 supplies a turn-on voltage to each gate (G1 and G2) of the transistors 14 and 15 of the switching circuit B1 when abnormal, high frequency voltage is applied to the supply voltage line 11. The transistors 14 and 15 are identical in size.

In the switching circuit B1 a drain D1 of the transistor 14 is connected to the supply voltage line 11. A source S1 of the transistor 14 is connected to a drain D2 of the transistor 15 via a node 18. A source S2 of the transistor 15 is connected to the reference voltage line 12. A gate G1 of the transistor 14 and the gate G2 of the transistor 15 are both connected via a node 19 between a capacitor 16 and a resistor 17 of the CR circuit B2. The switching circuit B1 does not operate during normal operation, that is, the transistors 14 and 15 are both turned off. When abnormal, high frequency voltage is applied, the turn-on voltage supply circuit (GR circuit) B2 supplies a turn-on voltage to turn on the transistors 14 and 15 simultaneously to discharge abnormal high frequency voltage into the reference voltage line 12 via each channel region of the transistors 14 and 15.

The operation of the power protection circuitry is described hereinafter.

First, part of abnormal, high frequency voltage resulting from static electricity applied to the supply voltage line 11 is discharged into the reference voltage line via the first discharge circuit A (the capacitor 13). In this case the pulse width of static electricity is usually up to 150 nanoseconds. The maximum is up to 1 microsecond. When high voltage of pulse width less than 150 nanoseconds is applied, the turn-on voltage supply circuit B2 (the capacitor 16 and the resistor 17) supplies a turn-on voltage to the gate G1 of the transistor 14 and the gate 62 of the transistor 15. The voltage levels of the gates G1 and 62 therefore rise so that the transistors 14 and 15 turn on. Thus abnormal, high frequency voltage applied to the supply voltage line 11 is discharged into the reference voltage line 12 via each channel region of the transistors 14 and 15. As a result, PN junctions of the integrated circuit, which are not shown in the drawings, are protected from an application of abnormal high frequency voltage, and damage to the circuit components is prevented.

When a large quantity of high frequency voltage is applied, high voltage is applied between the drain D1 of the transistor 14 and the source S2 of the transistor 15. As the transistors 14 and 15 turn on and start discharging the high frequency voltage, the electric potential of the source S1 of the transistor 14 rises while the voltage difference between the drain D1 and the source S1 of the transistor 14 decreases. The voltage difference between the drain D2 and the source 82 of the transistor 15 also decreases. That is, the high frequency voltage applied between the supply voltage line 11 and the reference voltage line 12 is divided by the two transistors 14 and 15 since the source of the transistor 14 and the drain of the transistor 15 are cascade connected with each other. As a result, the voltage difference between each drain and source of the transistors 14 and 15 decreases, which prevents damage to or deterioration of the transistors 14 and 15.

Hereinafter the optimum characteristic values for the capacitors 13 and 16 and for the resistor 17 as well as methods of forming the capacitors and resistor are examined.

The preferable capacitance of the capacitor 13 is 100 pF to 10 nF. The capacitor 13 may be formed by using a MOS structure with a gate electrode, a dielectric film, and a silicon substrate. The gate electrode may be made using a polycrystalline silicon or aluminum material, and the dielectric film may be of a silicon dioxide film ($SiO_2$), a nitriding film ($Si_3N_4$) or a laminated structure thereof, the last of which is preferable for minimizing the electrode resistance.

Each value for the capacitor 16 and the resistor 17 is to be set so that the transistors 14 and 15 turn on when abnormal, high frequency voltage resulting from static electricity is applied. However, the value should be set so that the transistors 14 and 15 do not turn on during normal operation or just when power is supplied to the integrated circuit. The specific method of setting the value is described hereinafter.

The rise time of the supply voltage Vcc when power is turned on is usually 10 to 100 microseconds, depending on the circuit configuration of the system. To prevent the transistors 14 and 15 from turning on at an application of voltage in such a manner that the rise time falls within the above range, the time constant of the turn-on voltage supply circuit B2 (the CR circuit) with the capacitor 16 and the resistor 17 is set to 1 microsecond or below. That is, the maximum of the time constant is to be 1 microsecond.

To set the minimum of the time constant, two factors are to be considered. One is the input capacitance of the transistors 14 and 15. The other is the discharge time required to fully discharge a large quantity of static electricity by turning on the transistors 14 and 15. To discharge static electricity generated by a human body (according to the Military Specification and Standard), the time constant of the CR circuit consisting of a capacitor of 100 pF and a resistor of 1.5 kiloohms is 150 nanoseconds. Though the relation between this model and actual static electricity is not clearly defined, it is known that static electricity is fully discharged when the time constant is set to 15 nanoseconds, a tenth of 150 nanoseconds, by the capacitor 13 and the junction capacitance inserted between the supply voltage line 11 and the reference voltage line 12. Therefore it is preferable that the minimum of the time constant of the CR circuit be set to 15 nanoseconds.

The capacitor 16 my be formed using the same method as the capacitor 13. To minimize the electrode resistance, it is preferable to use a polycrystalline silicon or aluminum material for electrodes, and a silicon dioxide film ($SiO_2$), a nitriding film ($Si_3N_4$) or a laminated structure thereof as a dielectric.

Figure 2:
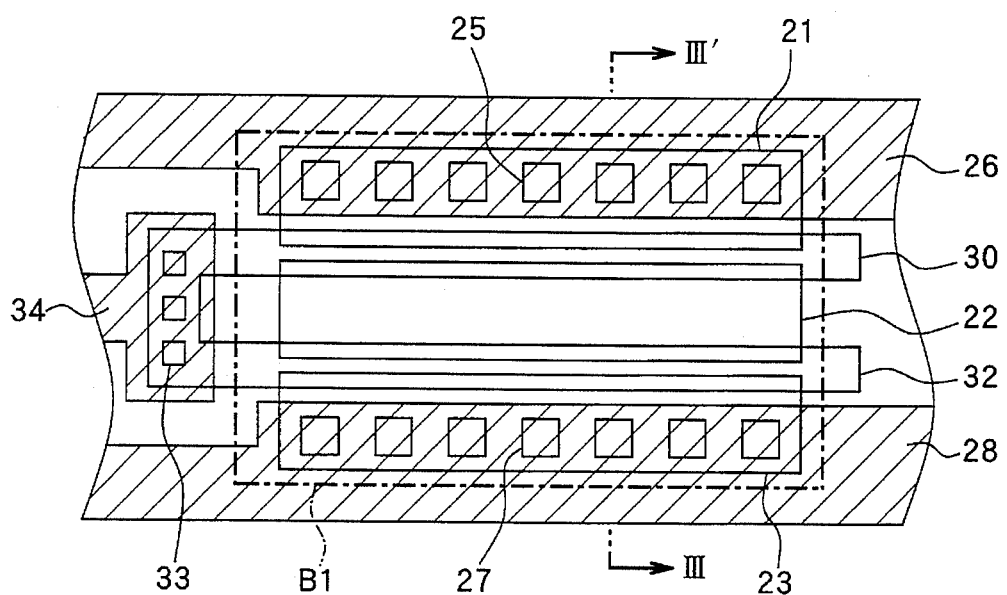
FIG. 2 is a top view of the main components of the power protection circuitry of FIG. 1.
Figure 3:
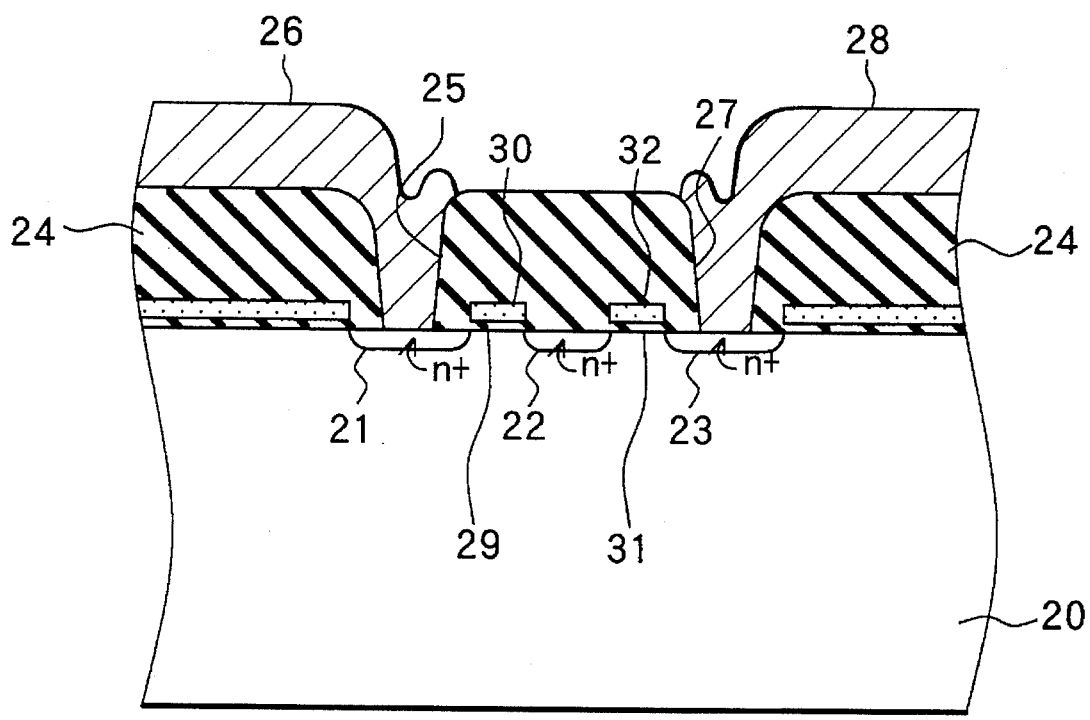
FIG. 3 is a cross-sectional view of the components of FIG. 1 taken along the line III—III'.

FIG. 2 shows the circuit pattern of the power protection circuit 1. FIG. 3 shows the cross-section taken along the line III—III' in FIG. 2. As shown in the figures, the drain D1 and the source S1 of the transistor 14 comprise an n+ diffusion layer 21 and an n+diffusion layer 22 formed on the main surface of a p-type semiconductor substrate 20 such as a p-type silicon substrate. The drain D2 and the source S2 of the transistor 15 comprise the n+ diffusion layer 22 and an n+ diffusion layer 23. That is, the n+ diffusion layer 22 doubles the source S1 of the transistor 14 and the drain D2 of the transistor 15.

The $n^+$ diffusion layers 21, 22 and 23 are located in the horizontal direction of FIG. 2, that is, in the direction of the width of the channels of the transistors 14 and 15, which are rectangle-shaped (linear-shaped) in parallel with each other. The $n^+$ diffusion layer 21 is connected to a power wiring layer 26 forming the supply voltage line 11 (FIG. 1) through a contact hole 25 formed in an intermediate isolation layer ($SiO_2$) 24. The n+ diffusion layer 23 is connected to a reference wiring layer 28 forming the reference voltage line 12 (FIG. 1) through a contact hole 27 in the intermediate isolation layer ($SiO_2$) 24. The power wiring layer 26 and the reference wiring layer 28 are made of, for example, aluminum. The power wiring layer 26 is located nearly directly above the diffusion layer 21 in a nearly parallel manner. The reference wiring layer 28 is located nearly directly above the diffusion layer 23 in a nearly parallel manner.

A gate electrode 30 of the transistor 14 is formed on a gate oxide film ($SiO_2$) 29 above the region between the n+diffusion layers 21 and 22 (the channel region). A gate electrode 32 of the transistor 15 is formed on a gate oxide film 31 above the channel region between the n+ diffusion layers 22 and 23. Like the n+ diffusion layers 21, 22 and 23, the gate electrodes 30 and 32 are located in the horizontal direction of FIG. 2, that is, the width of the channels of the transistors 14 and 15, which are rectangle-shaped (linear-shaped) and are parallel with each other. The gate electrodes 30 and 32 are connected to a common electrode layer 34 via a contact hole 33.

It is preferable that the plane structure of the transistors 14 and 15 be a linear structure as stated above, without bending the gates, drains and sources (into a 90 degrees angle, for example), or shaping them like a comb. In the preferred embodiment relatively large transistors are required as the transistors 14 and 15 to instantaneously discharge static electricity. However, even if the channel width of the transistors 14 and 15 is geometrically enlarged by shaping the transistors like a comb, it is impossible to enlarge the effective width of the channel because the distributed resistance exists especially when high frequency voltage is applied such as static electricity.

Though not shown in the figures, the capacitors 13 and 16 may be easily made following a known procedure. For example, an electrode may be made at the same step of manufacturing as the gate electrodes 30 and 31 of the transistors 14 and 15, which is to be connected to the power wiring layer and serves as a common plate electrode of the capacitors 13 and 16. Two n+ diffusion layers may be made at the same step of manufacturing as the n+ diffusion layers 21, 22 and 23, each of which is to be connected to the wiring layer to be the other electrodes of the capacitors 13 and 16. How to manufacture the resistor 17 is omitted since it is known that the resistor can be manufactured by using a MOS structure.

The power protection circuitry of the preferred embodiment enables the transistors 14 and 15 in the second discharge circuit B2 to turn on simultaneously to discharge via the channels of the transistors 14 and 15 into the reference voltage line 12. Therefore the amount of electricity which cannot be fully absorbed by the first discharge circuit B2 (the capacitor 13) is discharged to improve electrostatic resistance.

The transistors 14 and 15 turn on only at an application of abnormal, high frequency voltage resulting from static electricity and so on while the transistors 14 and 15 do not turn on during normal operation or just when power is supplied to the components of the integrated circuit. Therefore, abnormal, high frequency voltage resulting from static electricity applied to the power voltage line 11 is discharged into the reference voltage line 12 while a voltage of a normal level applied to the supply voltage line 11 is not discharged. No excess electric current flows so that the original operation of the integrated circuit is ensured without increasing power consumption during normal operation.

In the preferred embodiment, if an n-channel MOS transistor is included in the integrated circuit, the switching circuit B1 or the transistors 14 and 15 in the second protection circuit B may be formed in the same manufacturing process as that of n-channel MOS transistors in the integrated circuit. Therefore, there is no need to add any step to the original manufacturing process of the integrated circuit so that the process may be simplified. Since the preferred embodiment does not require a parasitic MOS transistor as one of the conventional methods does, the embodiment is applicable to an integrated circuit using the field shield isolation to isolate components of the integrated circuit as well as those using other isolating methods.

The n+ diffusion layers 21 and 23, as the drain of the transistor 14 and the source of the transistor 15, are covered with the power wiring layer 26 and the reference wiring layer 28 made of aluminum. A contact is made between the power wiring layer 26 and the n+ diffusion layer 21. Another contact is made between the reference wiring layer 28 and the n+ diffusion layer 23. The distributed resistance of the diffusion layers of the transistors is therefore reduced and a uniform electric field between the source and the drain is ensured.

Though the preferred embodiment uses n-channel MOS transistors as components of the second discharge circuit B1, p-channel MOS transistors may be used instead.

In the preferred embodiment the capacitor 13 is connected between the supply voltage line 11 and the reference voltage line 12, as the first discharge circuit A. The first discharge circuit A may be composed of a component other than a capacitor, which discharges part of abnormal, high frequency voltage applied to the supply voltage line 11 into the reference voltage line 12.

We claim:

1. Power protection circuitry for a semiconductor integrated circuit comprising:

a first discharge circuit connected between a voltage supply line and a reference voltage line of the semiconductor integrated circuit, which discharges part of abnormal, high frequency voltage applied to said supply voltage line into said reference voltage line; and a second discharge circuit, separate from said first discharge circuit, having a switching circuit including a pair of MOS transistors of the same conductivity type, and a turn-on voltage supply circuit supplying a turn-on voltage to each gate of said pair of MOS transistors at the application of the abnormal, high frequency voltage to said supply voltage line, which simultaneously turns on said pair of MOS transistors to discharge the rest of the abnormal, high frequency voltage into said reference voltage line via said pair of MOS transistors.

2. The power protection circuitry for a semiconductor integrated circuit according to claim 1, wherein: said first discharge circuit comprises a first capacitor connected between said voltage supply line and said reference voltage line of the semiconductor integrated circuit; and said second discharge circuit comprises:

(a) a first MOS transistor, one of said pair of MOS transistors, whose drain is connected to said voltage supply line;

(b) a second MOS transistor, the other of said pair of MOS transistors, whose conductivity type is the same as that of said first MOS transistor and whose drain is connected to the source of said first MOS transistor and whose source is connected to said reference voltage line and whose gate is connected to the gate of said first MOS transistor;

(c) a second capacitor connected between said voltage supply line and interconnected gates of said first and second MOS transistors; and (d) a resistor connected between said reference voltage line and interconnected gates of said first and second MOS transistors, which comprises a RC circuit with said second capacitor.

3. The power protection circuitry for a semiconductor integrated circuit according to claim 2, wherein a time constant of said RC circuit comprising said second capacitor and said resistor is 15 nanoseconds to 1 microsecond.

4. The power protection circuitry for a semiconductor integrated circuit according to claim 2, wherein diffusion layers forming said sources and drains of said first and second MOS transistors and gate electrodes are rectangle-shaped and positioned across a channel in parallel with each other.

5. The power protection circuitry for a semiconductor integrated circuit according to claim 4, further comprising a power wiring layer as said voltage supply line and a reference wiring layer as said reference voltage line, wherein:

said power wiring layer covers said diffusion layer forming said drain of said first MOS transistor;

a contact is made between said diffusion layer and said power wiring layer; said reference wiring layer covers said diffusion layer forming said source of said second MOS transistor; and another contact is made between said reference wiring layer and said diffusion layer.

* * * * *